United States Patent [19]
Roberts

[11] Patent Number: 5,526,565
[45] Date of Patent: Jun. 18, 1996

[54] HIGH DENSITY SELF-ALIGNING CONDUCTIVE NETWORKS AND CONTACT CLUSTERS AND METHOD AND APPARATUS FOR MAKING SAME

[75] Inventor: Joseph A. Roberts, Grafton, N.H.

[73] Assignee: Research Organization For Circuit Knowledge Limited Partnership, Grafton, N.H.

[21] Appl. No.: 245,707

[22] Filed: May 18, 1994

Related U.S. Application Data

[62] Division of Ser. No. 837,357, Sep. 6, 1994, Pat. No. 5,343,616.

[51] Int. Cl.⁶ .................................................. H01R 43/00
[52] U.S. Cl. .............................. 29/884; 29/611; 439/77
[58] Field of Search .......................... 29/825, 827, 884, 29/611; 439/77

[56] References Cited

U.S. PATENT DOCUMENTS

| | | |
|---|---|---|
| 2,427,144 | 9/1947 | Jansen . |
| 2,638,660 | 5/1953 | Gessel . |
| 2,716,268 | 8/1955 | Steigerwalt . |
| 2,837,619 | 6/1958 | Stein . |
| 2,912,745 | 11/1959 | Steigerwalt et al. . |
| 2,912,746 | 11/1959 | Oshry et al. . |
| 2,912,748 | 11/1959 | Gray . |
| 3,147,054 | 9/1964 | Alexander et al. . |
| 3,148,098 | 9/1964 | Beste, Jr. . |
| 3,158,421 | 11/1964 | Hasenauer, Jr. . |
| 3,301,730 | 1/1967 | Spiwak et al. . |
| 3,423,260 | 1/1969 | Heath et al. . |
| 3,434,208 | 3/1969 | Toomey et al. . |
| 3,488,890 | 1/1970 | Owens et al. . |
| 3,612,745 | 10/1971 | Warren . |
| 3,875,542 | 4/1975 | Holland et al. . |
| 3,889,363 | 6/1975 | Davis . |
| 4,020,548 | 5/1977 | Pohl . |
| 4,075,420 | 2/1978 | Walton . |
| 4,080,027 | 3/1978 | Benasutti . |
| 4,089,734 | 5/1978 | Bierig . |
| 4,091,125 | 5/1978 | Delgadillo . |
| 4,246,563 | 1/1981 | Noerholm . |
| 4,272,753 | 6/1981 | Nicolay . |
| 4,306,925 | 12/1981 | Lebow et al. . |
| 4,357,750 | 11/1982 | Ostman . |
| 4,406,062 | 9/1983 | Navarro . |
| 4,528,259 | 7/1985 | Sullivan . |
| 4,532,152 | 7/1985 | Elarde . |
| 4,604,799 | 8/1986 | Gurol . |
| 4,651,417 | 3/1987 | Schumacher, III et al. . |
| 4,655,518 | 4/1987 | Johnson et al. . |
| 4,721,550 | 1/1988 | Schumacher, III . |
| 4,775,611 | 10/1988 | Sullivan . |
| 4,806,106 | 2/1989 | Mebane et al. ................. 29/827 X |
| 4,840,702 | 6/1989 | Schumacher, III . |
| 5,088,009 | 2/1992 | Harada et al. . |
| 5,097,101 | 3/1992 | Trobough . |
| 5,184,111 | 2/1993 | Pichl . |

FOREIGN PATENT DOCUMENTS

| | | | |
|---|---|---|---|
| 963237 | 2/1975 | Canada | ............................ 29/825 |
| 1515382 | 10/1969 | Germany . | |
| 2136386 | 2/1973 | Germany . | |

OTHER PUBLICATIONS

Action News, Spring/Summer 1990, Action Technologies, Inc. "Molded Flexible Circuits".

IBM Technical Disclosure Bulletin, vol. 9 No. 3 Aug. 1966, pp. 236-237, D. G. Pittwood et al.

*Primary Examiner*—Carl J. Arbes
*Attorney, Agent, or Firm*—Davis, Bujold & Streck

[57] ABSTRACT

A conductive network, which can be flexible or rigid, can have self-aligning conductors which connect with corresponding conductors of other networks. The conductive network can be fabricated into densely packed contact clusters for use as electrical interconnectors or circuits. The contact clusters, which can be configured to substantially any shape, are the essential components of high density connector assemblies. The methods and apparatus for making the conductive network and cluster contacts are also described.

9 Claims, 5 Drawing Sheets

HIGH DENSITY SELF-ALIGNING CONDUCTIVE NETWORKS AND CONTACT CLUSTERS AND METHOD AND APPARATUS FOR MAKING SAME

This is a Division of application Ser. No. 07/837,357 filed on Sep. 6, 1994, now U.S. Pat. No. 5,343,616.

This invention generally relates to both flexible and rigid conductive networks and high density connectors, and their manufacture. In particular, this invention relates to conductive networks which have densely packed conductive paths and to connector assemblies, and to a method and apparatus for making the conductive networks and connector assemblies.

BACKGROUND OF THE INVENTION

The growth which the computer and electronics industries have experienced in the last three decades has dramatically increased the demand for conductive networks (for example, printed circuit boards (PCB's)). This has led to the use of more densely packed electrical modules and circuits, each requiring multiple interconnections to one another. This requirement to increase printed circuit (PC) board density to accommodate yet another generation of new high power integrated circuit (IC) chips, combined with the requirement to incorporate surface mount technology, continues to drive PC board density to new levels of sophistication. However, there is a practical limit to the density that can be achieved using conventional circuit board connectors.

There is a great need for high quality, low cost, densely packed interconnect cables and equally densely packed connector clusters for coupling the cables to the surface mounted terminals of PC boards and modules. In a typical present day application, a floppy disk drive may require a flexible connection to a recording head whose conductors are only on the order of 0.2 mm (0.008 inches) on center. This means that the jumper's conductors must have a similar spacing. Also, the new liquid crystal displays have conductors which are even more closely packed, for example, 0.1 mm (0.004 inches) on center, and which must be interconnected to other PC boards and modules. Still further, there is growing use of ceramic PC boards to accommodate multiple IC chip arrays which also require high density connectors and customer interconnect cables for purposes of terminating those components.

As a direct result of the growth in the circuit board industry, there has been a parallel increase in the volume of environmentally-hazardous chemicals generated by the conventional etching and deposition processes. For example, it is not uncommon for one circuit board fabrication facility to generate 4000 liters (1,000 US gallons) per day of photoresist stripper and (4800 liters) (1,200 U.S. gallons) per week of developer solution. These toxic wastes must be transported off-site for proper disposal at hazardous waste management sites. Thus, there is an urgent need for a non-chemical method for the manufacture of conductive networks.

It is an object of this invention to provide relatively inexpensive, high-quality, densely packed, conductive network, contact clusters and connector assemblies with densely packed contact clusters having the self-aligning capabilities for use in fabricating rigid or flexible circuit boards, that can be built without the use or generation of environmentally hazardous chemicals.

A further object of the invention is to provide a connector assembly having contact clusters attached which significantly increase the number of signals that each contact position can interconnect and which are specially profiled to align and to interlock with the conductive paths of networks to which they are connected.

Yet another object of the invention is to provide methods of making conductive networks, contact clusters and connector assemblies having one or more of the above advantages.

SUMMARY OF THE INVENTION

According to this invention, a flexible conductive network is made by shaping a metallic material (for example, copper sheet or foil with or without plated on, or inlaid, contact points) to form a desired conductor pattern on the sheet. (For example, in accordance with a preferred embodiment of the invention, gold can be precisely located on the metallic sheet at a position which, in the finished conductor, will correspond to a contact termination.)

The process of the present invention offers significant advantages over the conventional imaging and etching or additive (plating-up) techniques normally used to PCB or flexible printed circuit conductive networks. It reduces labor costs and produces improved yields. It also allows the use of metal sheets or foils with minor inclusions which cannot be used in a process involving etching because it would result in non-uniform etch rates. Further, in the process of this invention, the throughput is the same for circuits whose metal foils have different thicknesses. This contrasts to the usual imaging-etching process wherein the line speed is directly proportional to the foil weight because it takes longer to etch thick foil than thin foil. The process of this invention results in additional savings because it is a dry process which does not entail the added expenses related to ancillary processing of hazardous materials and chemical disposal.

The process can be used to make high-density contact clusters for connector assemblies. In this case, specially profiled conductive paths are designed to interlock or interfit with the contacts or conductors of a mating conductive network. The metal foil can be formed in the same manner described above to form at least one shaped conductor cluster which is attached to, but is electrically insulated from, a metal spring structure. The contact cluster may be manufactured independently and attached to the spring material; however, the precision required to achieve fine line circuitry suggests that the configured spring and contact cluster (shaped to facilitate contact forming and enhance conductor compliance) is preferably made as one laminated structure.

According to the invention there is provided a high density contact cluster comprising a conductive network having a plurality of conductive paths electrically insulated from one another, a first end of said conductive paths being shaped to form a contact region having at least one pair of parallel, spaced apart, clip arms oriented in a plane normal to the plane of said conductive network, such that pairs of said clip arms are in spaced apart, opposed juxtaposition to one another.

According to the invention there is provided a contact cluster comprising a flexible conductive network having a dielectric layer, a metallic layer adhered to said dielectric layer, and a spring layer overlying at least a portion of said dielectric layer; said metallic layer of said conductive network having conductive paths electrically insulated from one another; said conductive network having a connector region for electrical and mechanical connection to a first connecting member such that a first end, said conductive paths are shaped to form a contact region having a plurality of spaced-apart clip arms oriented parallel to a common axis in a spaced-apart relation to one another; and said conductive network, at a second end, having each path forming a clip member for mechanically interlocking with conductive contacts of a second connecting member.

According to the invention there is provided a flexible circuit comprising a flexible conductive network having a dielectric layer, a metallic layer adhered to said dielectric layer, and a spring layer overlapping at least a portion of said dielectric layer, wherein said metallic layer comprises a plurality of conductive paths electrically insulated from one another; a first end of said conductive paths being shaped to form a contact region having at least one pair of parallel, spaced-apart, clip arms oriented parallel to a common axis; a second end of said conductive paths being oriented to form a clip member for mechanically interlocking with conductive contacts of a connecting member; and one or more circuit elements connected to selected conductive paths in a circuit configuration.

According to the invention there is provided a connector assembly for connecting multiple conductors of a flexible cable to conductive contacts of a connecting member comprising a connector housing, a plurality of high-density contact clusters juxtapositioned side-by-side in said housing, each said contact cluster aligned along respective parallel axes, and said contact clusters being integral with a connecting cable having a planar orientation substantially normal to said parallel axes, and an aperture in said housing to receive the ends of said connecting member.

According to the invention there is provided a method of manufacturing a contact cluster comprising the steps of forming a thin, flexible conductive network having electrically insulated conductive paths; bending said conductive paths at a first terminus to form a first clip section; bending said conductor paths at a second terminus to form a second clip section; and bending said second clip sections such that said conductive paths of said clip sections are biased to a selected spaced apart relationship by a spring layer.

According to the invention there is provided an apparatus for manufacturing a high density contact cluster comprising means for forming a planar sheet of conductive material into a non-planar pattern; means for adhering a flexible dielectric material to said first side of said sheet; means for adhering a sheet of spring material to said flexible dielectric material; means for removing raised portions of conductive material from a second side of said conductive sheet to form electrically insulated conductive paths of said conductive material; means for bending said conductive paths at a first terminus to form at least one clip section; means for bending said conductive paths at a second terminus to form at least one clip section; and means for bending said second terminus clip sections in a selected pattern for positioning said clip sections in a selected, spaced apart relationship.

BRIEF DESCRIPTION OF THE DRAWINGS

The invention will now be described, by way of example, with reference to the accompanying drawings, in which.

Unlike some conventional techniques for fabricating conductive networks (for example, etching and deposition), the process of this invention does not use etchants, environmentally-hazardous resist, stripper, and developer solutions. Thus, the expense and environmental hazards associated with having the resist, stripper and developer waste solutions transported to toxic waste management sites is eliminated. Further, the process of this invention eliminates common yield problems associated with conventional etched circuits, such as: artwork distortion, scratched or bad acid resistant ink, inconsistent etching caused by dirt or dust, and questionable etching chemistry. Thus, the use of this process will clearly result in a reduction in labor costs and an increase in product yield.

The process of this invention offers additional advantages over conventional etching processes. The foil used in etching processes must be free of impurities to insure uniform etch rates. However, copper foil with minor inclusions can be used with the process described herein. In addition, the etching process is directly affected by the thickness of the foil because the line speed is directly proportional to the foil weight (the thicker the foil, the slower the line feed).

Figure 1:
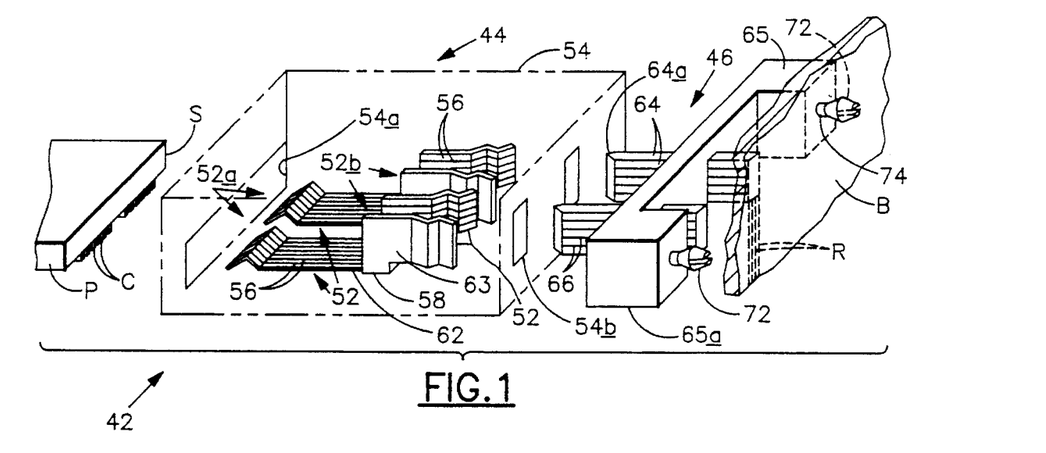
FIG. 1 is an exploded axonometric view of a connector assembly incorporating self-aligning contact clusters having female contact regions.
Figure 2:
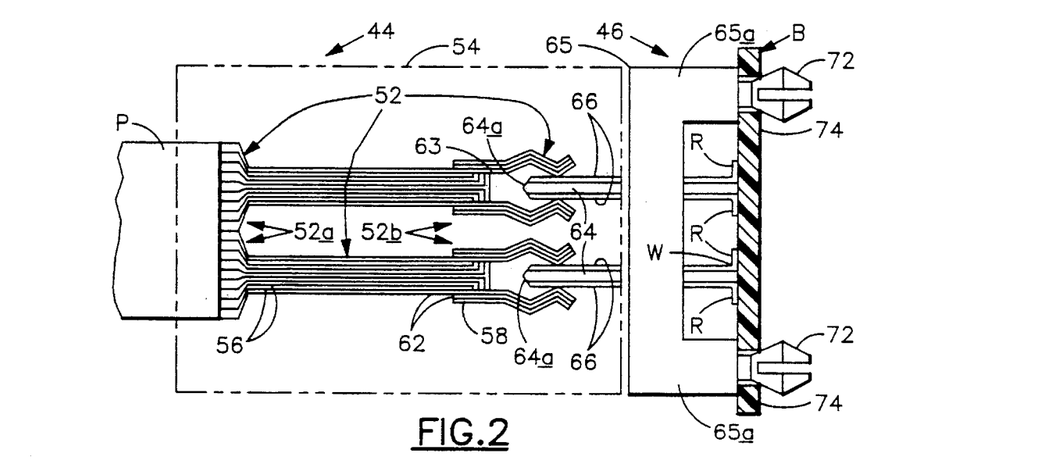
FIG. 2 is a plan view showing the elements of FIG. 1 assembly coupled together.
Figure 3:
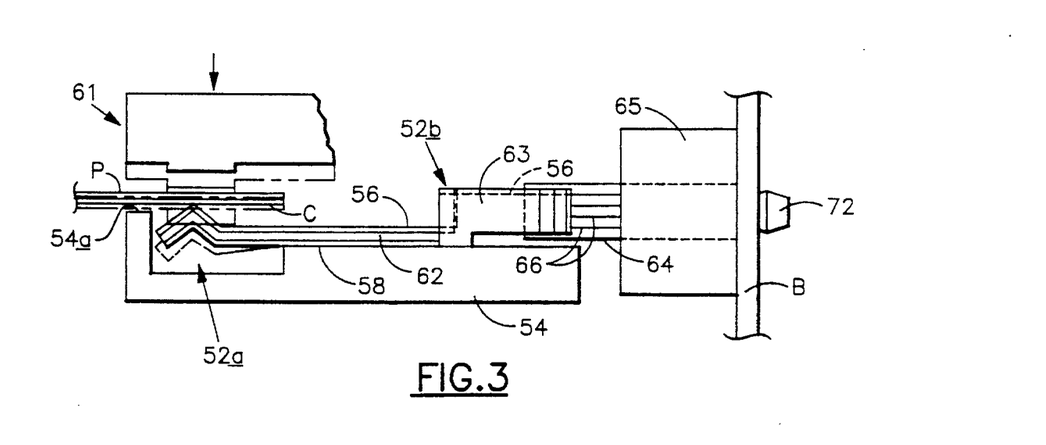
FIG. 3 is an elevational view showing the elements of the FIG. 1 assembly coupled together.

FIGS. 1, 2 and 3 illustrate an example of one particular type of connector assembly with high density contact clusters made using a flexible conductive network preferably manufactured using the coining-laminating-grinding process herein described. The connector assembly, shown generally at 42, is designed to connect the conductors C of a more or less conventional flexible printed circuit P to the conductive paths or runs R of a more or less standard PC board B. Connector assembly 42 is made up of a female connector section shown generally at 44 which is arranged to be connected electrically and mechanically to printed circuit P so as to terminate the conductors C thereon. The other component of assembly 42 is a male connector section 46 which is connected electrically and mechanically to PC board B so as to terminate the conductor runs R thereon. When the two connector assembly sections 44 and 46 are coupled together as shown in FIGS. 2 and 3, they establish electrical continuity between the conductors C of circuit P and the conductive runs R of PC board B.

Illustrated connector section 44 has one or more densely packed contact clusters 52 juxtapositioned side-by-side in a housing shown in phantom at 54. Each contact cluster consists of a pattern of closely spaced conductors 56 attached to, but electrically insulated from, a metal leaf spring layer 58 by means of a dielectric interlayer 62. The conductors 56, at their contacts, can have any of a variety of configurations, for example, a juxtaposed flat configuration, a square configuration, a round configuration, etc. The pattern of conductors may be manufactured independently and attached to the spring layer 58.

Spring layer 58 primarily functions as a support structure which (1) supports the integrity of the conductive paths as they proceed through the manufacturing process, (2) adds structural integrity to the conductive network as it is assembled into a connector housing, and (3) adds structural integrity to the conductive network as it engages a mating contact. However, the spring layer can be independently removed from those regions of the contact cluster which require greater flexibility.

In addition, the spring layer can act as a heat sink, thereby allowing circuit designers to control the temperature rise of heat generating elements. In order to have the spring layer function effectively as a heat sink, the base dielectric and adhesive between the spring and the heat generating elements must be removed (pre-windowed) prior to the first lamination step. In this way, the body of a heat generating element (active chip) can be attached to the metal support structure and effectively disperse unwanted heat.

Alternatively, or in selected embodiments, simultaneously, the spring layer may act as a ground return in those applications requiring controlled impedance or shielding. To do so, the base dielectric and adhesive must be removed (pre-windowed, pre-punched, drilled, user skived, etc.), from the contact point, prior to the first lamination.

The conductive paths, dielectric layer and spring layer may be individually fabricated and then joined together; however, they are preferably constructed as one laminated structure according to the process described below. Still referring to FIGS. 1, 2 and 3, the end of each contact cluster 52 proximate printed circuit P (the left-hand end as viewed in the figures) is bent to form an inverted V-shaped clip 52a at that end of each contact cluster 52. A slot 54a is provided in the end of housing 54 adjacent clips 52a so that the end of the printed circuit P can be inserted into the housing. When the circuit P is properly seated in the housing, its conductors C are aligned and make electrical contact with the conductive paths 56 in the contact clusters 52. In other words, the conductive paths 56 are shaped or profiled so that the segments thereof at clips 52a interfit and interlock with the conductors C of printed circuit P to assure that the corresponding conductors of the connector section 44 and the circuit P are aligned mechanically and are in electrical contact. The contact clusters 52 and conducts C are thus self-aligning. The circuit may be resiliently engaged or clamped to the contact clusters 52 by a suitable conventional clamping mechanism 61 incorporated into housing 54 as shown in FIG. 3.

The opposite ends of the contact clusters 52, (the ends facing the connector section 46) can be shaped to form contact regions. In this illustrated embodiment, each contact region comprises a pair of parallel, spaced-apart, clip arms 63 (bent a cumulative angle of about 180° from their original planar position) which are preferably oriented in a plane substantially normal to the plane of said conductive network, such that the pairs of right-hand end segments of the conductive paths 56 (clip arms 63) are biased to a selected spaced apart relationship by the spring layer 58 of the contact cluster. Referring to FIGS. 1–3, clip arms 63 are bent inward such that the conductive paths 56 on each clip arm face one another, thereby forming a female contact region or socket 52b. Vertically oriented slots 54b are provided in the adjacent end of housing 54 so that the sockets 52b can receive bayonet-type electrical contacts projecting from connector section 46 when that section is coupled to section 44.

Figure 4:
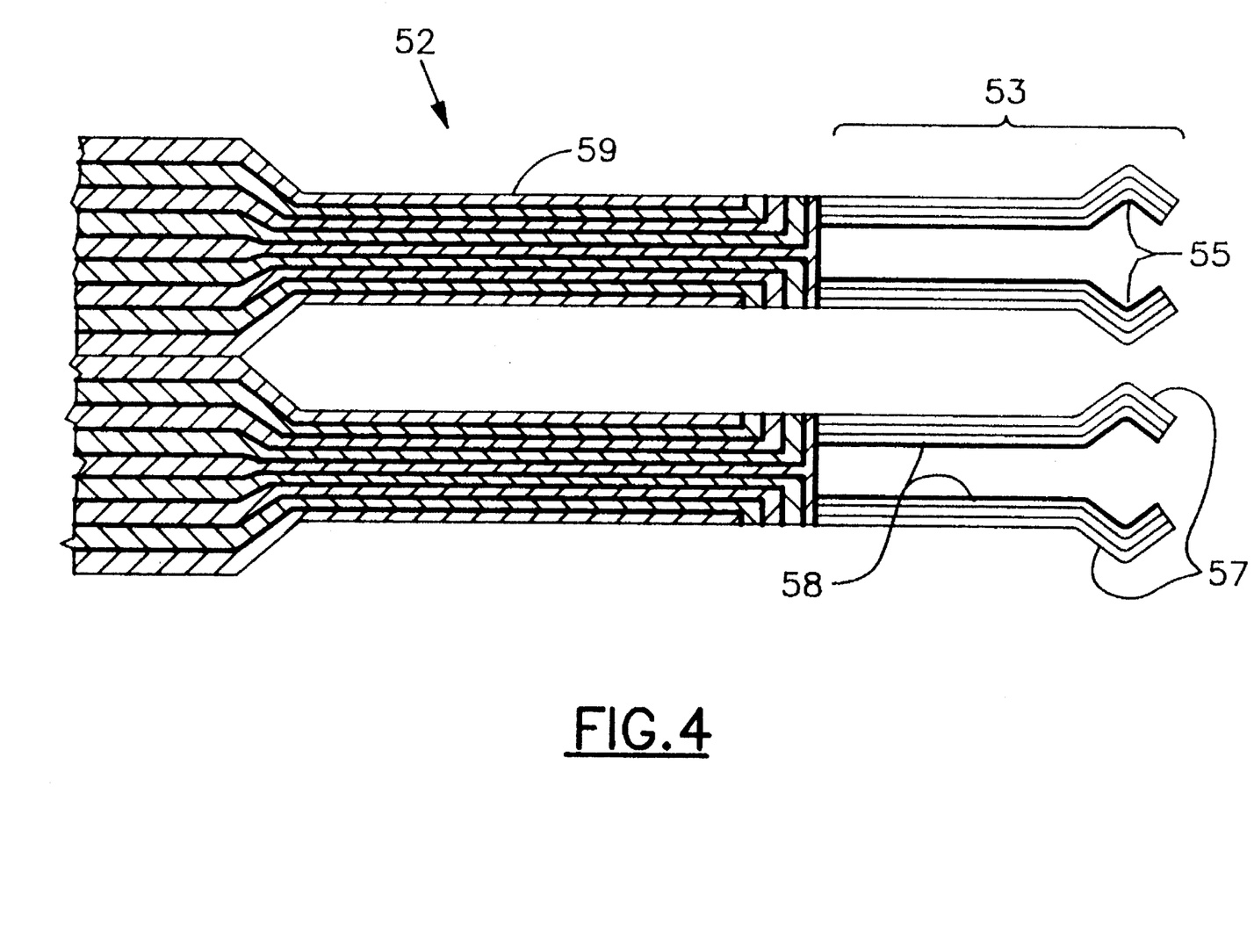
FIG. 4 is a plan view showing two contact clusters which have male contact regions.
Figure 5:
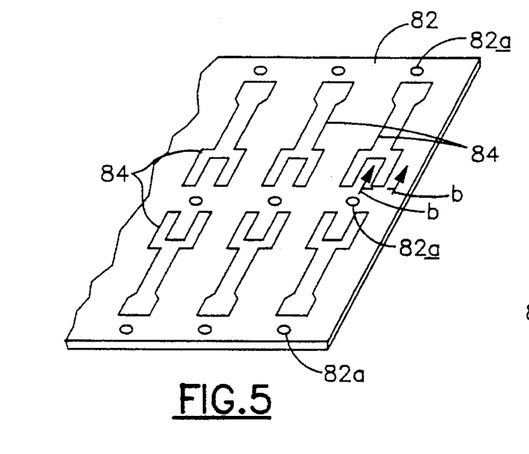
FIG. 5 is a view showing the layout of contact clusters for making the FIG. 1 assembly.

Alternatively, as shown in FIG. 4, the opposite ends of the contact clusters 52 can be shaped to form male contact regions or contact pins 53. In FIG. 4, each contact pin 53 comprises a pair of parallel, spaced-apart clip arms 55 (bent outward a cumulative angle of about 180° from their original planar position) which are preferably oriented in a plane substantially normal to the plane of conductive network 59, such that the conductive paths 57 on the clip arms 55 face away from one another. In general, contact pin 53 is designed to be plugged into a receptacle, which is designed to accommodate conventional butt soldering techniques, and will carry multiple (for example, four) conductive paths on each clip arm. Vertically oriented slots are provided in the adjacent end of the connector housing so that the pins can interconnect with the electrical contacts of a circuit board.

As noted above, in other embodiments of the invention, the connections can consist of male or female contact clusters having contacts formed into round, square, or other shaped patterns. Thus a plurality of clip arms can be bent to form a round contact pattern 63a.

Referring again to FIGS. 1, 2 and 3, connector section 46, in the illustrated embodiment, comprises a generally C-shaped base 65 of a suitable dielectric material. Base 65 supports a set of parallel spaced-apart, vertically oriented blades 64, segments of which extend through base 65 between its legs 65a toward housing 54. The number of blades 64 corresponds to the number of sockets 52b in connector section 44. The spacing between the blades is the same as that of the sockets (for example less than 0.10 inches in one illustrated embodiment) so that when the connector sections 44 and 46 are coupled together as shown in FIGS. 2 and 3, the blades 64 project through slots 54b and are engaged in the sockets 52b in section 44. preferably, the blades 64 are provided with tapered ends 64a to facilitate these engagements.

Each blade 64 carries a cluster of parallel printed conductors 66 on each face of the blade, the number corresponding to the number of conductors 56 on the corresponding socket clip arm 63. When the two connector sections are coupled together, the conductors 66 on each blade 64 are arranged to interfit with the conductors 56 on the clip arms of the corresponding sockets 52b in connection section 44 so that reliable electrical connections are established between the conductors in the two connector sections.

Blades 64 extend through the bridging portion of base 65 and are long enough so that when base legs 65a are properly positioned against PC board B as shown in FIGS. 2 and 3, the right-hand ends of blades 64 butt against the adjacent surface of PC board B such that the blade conductors 66 can be aligned with terminal areas or tabs (not shown) at the ends of the printed circuit runs R on the PC board. To secure the connector base 65 at the appropriate place on the PC board B for such alignments to occur, the base is provided with a pair of bifurcated locating posts 72 at the ends of legs 65a which are arranged to snap into appropriately placed holes 74 on the PC board B. Once the base 65 has been secured to the PC board, the tab conductors 66 can be butt soldered to the corresponding conductor runs R of the PC board B as shown at W in FIG. 2.

Thus, when connector sections 44 and 46 are connected to the respective circuits P and B and are coupled together as shown, reliable fine-line electrical connections are established between the conductors C of circuit P and the conductive runs R of PC board B.

It is important to note that although the conductive networks of the contact clusters 52 are preferably made using the coining-laminating-grinding process herein described, the conductive networks can be fabricated by any one of a number of processes including: (1) vacuum forming the conductive network onto a sheet of dielectric material using a template; (2) electro forming the conductive network onto a transfer template and then transferring to a flexible or rigid substrate using conventional adhesives and laminating techniques; and (3) mechanically creasing or heat forming conductive paths into conventionally fabricated conductors.

Figure 6:
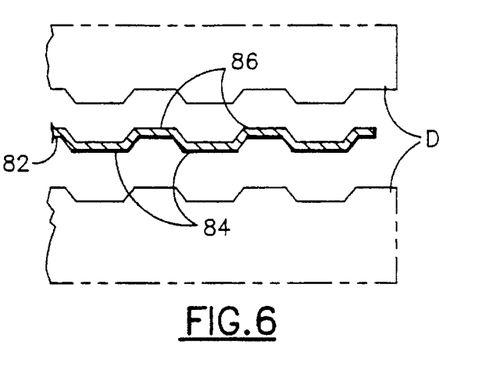
FIG. 6 is a sectional view, greatly enlarged, taken along lines 6—6 of FIG. 5 and illustrating the die used to form the non-planar contact cluster.

The coining-laminating-grinding process depicted in FIGS. 5 to 15. In accordance with this process, a sheet 82 of metallic material (for example, 0.0014 inch copper foil) preferably with two parallel strips of inlaid pressure fused gold 56a (FIG. 11) suitable for electric contacts is drawn from a roll, cleaned and fed precisely between a pair of coining dies D which form a pattern of ridges 84 and waste areas 86 on opposite sides of the sheet, the pattern corresponding to the pattern of contacts or conductors 56 in connector section 44. The inlaid gold strips will form contact areas as described in more detail below. Preferably, the sheet 82 is provided with sprocket holes 82a which register with sprockets in a feed mechanism (not shown) so that the strip is guided precisely to the proper location between dies D. This coining process embosses the unwanted or waste sheet areas 86 approximately 0.002 to 0.005 inches above the surface of ridges 84 as shown in FIG. 6. The forming process effected by the dies D also stress-hardens the raised waste areas 86 of the foil between the ridges which strengthens the sheet 82 in preparation for the in line laminating process described below.

Figure 7:
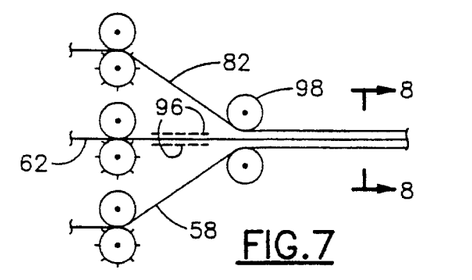
FIG. 7 is a diagrammatic view illustrating the laminating step in the manufacture of a contact cluster.
Figure 8:
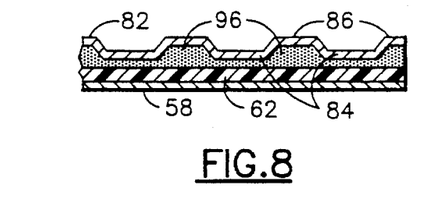
FIG. 8 is a sectional view, greatly enlarged, taken along lines 8—8 of FIG. 7.

As shown in FIGS. 7 and 8, the preformed metallic sheet 82 is next registered to a sheet 58 of spring metal (for example, beryllium copper) drawn from a roll, such that the waste areas 86 of the foil face away from the sheet 58. Fed inbetween sheets 58 and 82 is a sheet 62 of a flexible dielectric material (for example, 0.001 polyester) which may be pre-punched (windowed) to expose ground connections and/or pressure fused interconnecting points. If desired, pressure fused interconnections can be made as the two conductive sheets, each having opposing stress hardened domes located at the points to be interconnected, pass between the high pressure nip rollers. This is accomplished as the two sheets of conductive material are registered to each side of the pre-punched flexible dielectric material. The opposing stress hardened domes are pressure fused as they pass through the high pressure nip rollers. In addition, each interconnect is structurally reinforced through the laminating process as described in more detail below.

An adhesive material 96, in this illustrated embodiment, is provided on both faces of sheet 62 so that when the three sheets are pressed together by the nip rollers 98, they become laminated forming a single composite sheet consisting of the conductive top layer 82, the intermediate dielectric layer 62 and the bottom spring layer 58, with the adhesive material 96 filling the spaces under the metal waste areas 86 of layer 82, as best seen in FIG. 8. In other embodiments, the dielectric layer 62 can be fused or melted without causing conductor distortion (swim), thereby eliminating the need for an adhesive between layer 62 and the conductive top layer 82.

Figure 9:
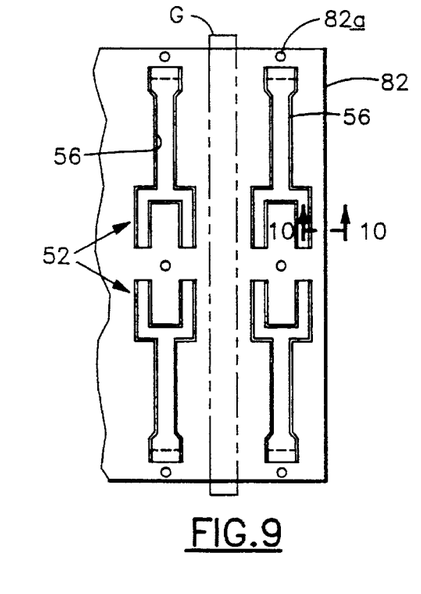
FIG. 9 is a top plan view of a laminate material illustrating the result of the precision grinding step in the manufacture of the contact cluster assembly.
Figure 10:
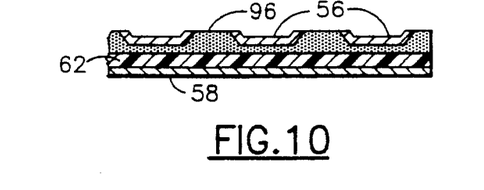
FIG. 10 is a sectional view, greatly enlarged, taken along lines 10—10 of FIG. 9.

According to the next step of the process, the laminate is fed through a precision grinding station shown in phantom at G in FIG. 9 which removes some (for example, 0.0015 inches) of the raised waste areas 86 of sheet 82, as well as some of the adhesive material 96 thereby electrically insulating the adjacent ridges 84 and establishing the final shapes of those ridges which now correspond to the patterns of conductive paths 56 of the contact clusters 52 in the connector section 44 shown in FIGS. 1 to 3. After being cleaned, the laminate illustrated in FIGS. 9 and 10 is subjected to a stamping and forming process using progressive dies, the various steps in this process being illustrated in FIG. 11.

Figure 11:
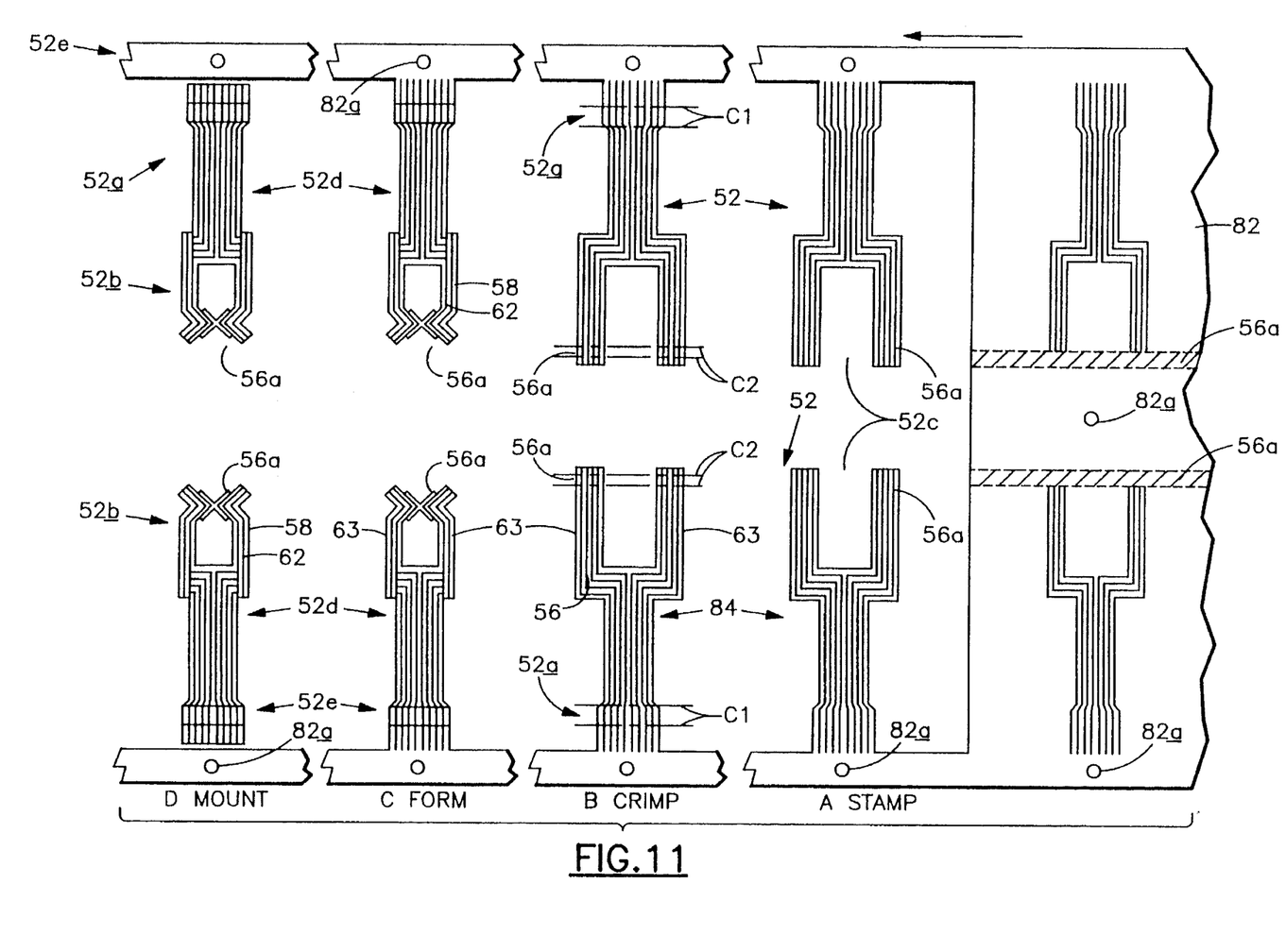
FIG. 11 is a top plan view illustrating the successive steps involved in forming the shaped contact clusters of a connector assembly.

Referring to FIG. 11, wherein the parallel strips of inlaid pressure fused gold 56a will act as terminal contacts as described hereinafter, at station A of the process, the laminate is stamped to remove unwanted material around the contact clusters 52 including the strip of material 52c between opposing pairs of clusters that contains the central line of sprocket holes 82a. Next, at station B, the laminated strip is crimped along lines C1 and C2 which define the clips 52a and socket clip arms 63 (FIG. 2).

The laminated sheet then advances through a forming station C which, in the illustrated embodiment, bends the clip arms 63 of each cluster 52 through a cumulative angle of about 180° and preferably to a plane where each is normal to the laminate body to form the sockets 52b. Finally, after being cleaned and if desired, provided with suitable surface coating (wherein the inlaid contact material is not provided), the succession of formed connectors 52d is advanced to a mounting station D at which each connector 52d is registered and adhered to a housing 54 (FIG. 3). The individual clusters 52 are then separated from the remaining side edge margins 52e of the laminated strip which have functioned as a stabilizing lead frame during the stamping and forming process. The inlaid or plated gold strips, because of the accurate registration, according to the invention, are positioned to act as contact terminals for the structure.

It is noted from the foregoing that the process of this invention allows the production of fine-line flexible conductive networks (for example, circuits and jumpers) and conventional, high volume, printed circuit boards at relatively low cost. The same principles may be followed to produce densely-packed contact clusters for incorporation into connectors used to interconnect such fine-line circuits.

Figure 12:
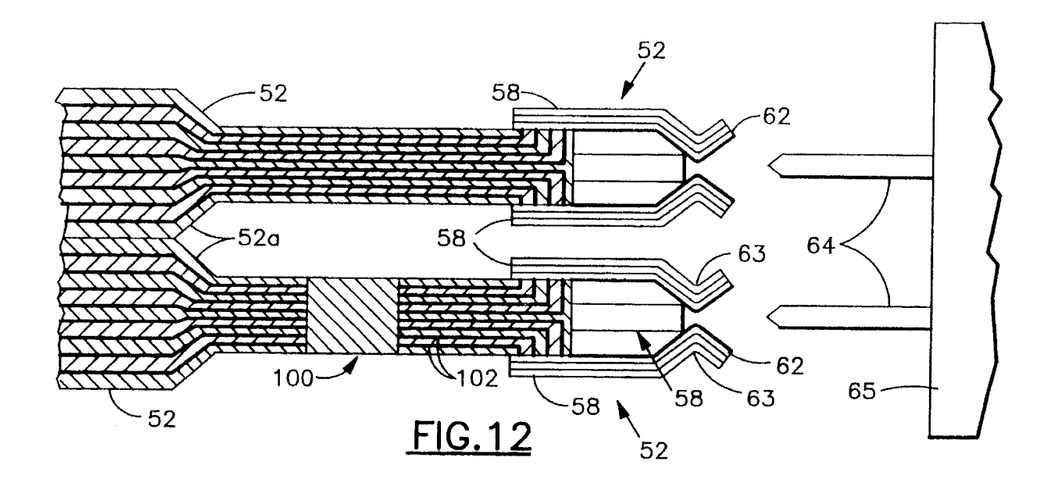
FIG. 12 is a plan view of a flexible conductive network including a circuit device making connection between the conductors of the network.

Referring to FIG. 12, it is not necessary that the conductors formed in accordance with the invention actually form through electrical paths from one connection point, for example runs R on printed circuit board B to a second connection point, for example conductors C. The unique construction of the circuit allows for the connection thereto of active or passive circuit devices thereby enabling a connection block housing such as housing 54 to provide more than mere connectivity between electrical nodes or points. The conductive paths of the circuit function as female receptacles into which the male conductor of a circuit device may be positioned. This self aligning/locking capability is of particular importance when assembling fine line 0.2 mm (0.008 inches) on center components. Thus, referring to FIG. 12, an integrated circuit, or other active or passive circuit 100 can be connected in circuit with various of the conductive paths 102 thus completing active or passive connections between conductive paths.

Such integrated circuits can act as amplification devices, impedance matching devices, computer devices, etc. and can have a broad range of applicability. Indeed, such devices have unlimited scope depending upon the design and application of the flexible conductive network to which they are attached.

Figure 13:
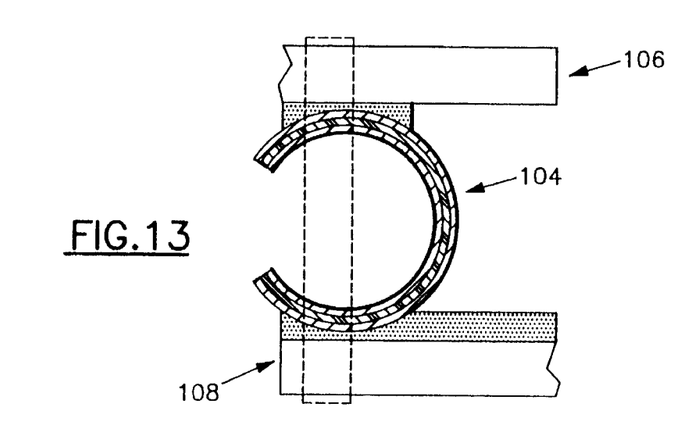
FIG. 13 is an elevation view of a flexible conductive network formed into a "C" configuration for interconnecting two printed circuit boards.

Referring now to FIG. 13, it can be seen that the flexible circuit of this invention can be used to interconnect the conductive paths of circuit boards which are in a multi-layer configuration. Flexible conductive network 104, for example, a circuit connection having over one hundred conductors within a one inch connector width and backed with a spring member, is formed into a "C" configuration which can be sandwiched between two printed circuit boards 106, 108 to interconnect required signals from the conductive paths of the different circuit boards. This configuration offers a compliant, self-aligning low cost interconnect.

I claim:

1. A method of manufacturing a contact cluster comprising the steps of:
   a) providing a thin, flexible conductive network having electrically insulated conductive paths;
   b) bending said conductive network at a first terminus to form a clip section;
   c) bending said conductive network at a bifurcated second terminus to form a pair of clip arms; and
   d) bending said pair of clip arms such that said conductive paths of said pair of clip arms are biased into substantially parallel planes spaced a selected distance apart by a spring layer.

2. The method of claim 1 wherein step d) comprises bending said pair of clip arms inward, such that said conductive paths at said pair of clip arms face one another.

3. The method of claim 1 wherein step d) comprises bending said pair of clip arms outward such that said conductive paths of said pair of clip arms face away from one another.

4. The method of claim 1 wherein said step of forming said conductive network comprises the steps of:
   forming a planar sheet of metallic material into a non-planar pattern;
   adhering a flexible dielectric material to a first side of said sheet;
   adhering a sheet of spring material to at least portions of said dielectric material; and
   removing raised portions of metallic material sheet from a second side of said sheet to form said electrically insulated conductive paths.

5. The method of claim 1 wherein said step of forming said conductive network comprises the steps of:
   etching conductive paths in a solid sheet material; and
   mechanically creasing said conductive paths to form channels having inclined side walls.

6. The method of claim 1 wherein said step forming said conductive network comprises the steps of:
   depositing a conductive material to form said conductive paths; and
   mechanically creasing said conductive paths to form channels having inclined side walls.

7. The method of claim 1 wherein said forming step comprises the step of coining said metallic sheet.

8. The method of claim 1 wherein said removing step comprises the step of precision grinding said raised portions of said sheet.

9. The method of claim 4 further comprising the step of removing discrete internal regions of said dielectric material prior to said adhering step.

* * * * *